(12) United States Patent
Jitaru

(10) Patent No.: US 6,469,486 B1
(45) Date of Patent: *Oct. 22, 2002

(54) FLUX EQUALIZED TRANSFORMER CIRCUIT

(75) Inventor: Ionel Jitaru, Tucson, AZ (US)

(73) Assignee: Ascom Energy Systems AG, Berne (CH)

(*) Notice: Subject to any disclaimer, the term of this patent is extended or adjusted under 35 U.S.C. 154(b) by 0 days.

This patent is subject to a terminal disclaimer.

(21) Appl. No.: 09/542,068

(22) Filed: Apr. 3, 2000

Related U.S. Application Data

(63) Continuation of application No. 09/310,626, filed on May 12, 1999, now Pat. No. 6,046,918, which is a continuation-in-part of application No. 09/086,365, filed on May 28, 1998, now Pat. No. 5,973,923.

(51) Int. Cl.[7] ................................................. H01F 27/42
(52) U.S. Cl. ....................................... 323/356; 323/361
(58) Field of Search ................................... 323/356, 361

(56) References Cited

U.S. PATENT DOCUMENTS

| | | | | |
|---|---|---|---|---|
| 3,076,131 A | * | 1/1963 | Weil | 363/95 |
| 3,681,526 A | * | 8/1972 | Camras | 178/6.6 A |
| 3,862,411 A | * | 1/1975 | Persson | 323/361 |
| 5,036,428 A | * | 7/1991 | Brownhill et al. | 361/386 |
| 5,576,934 A | * | 11/1996 | Roethlingshoefer et al. | 361/761 |
| 5,581,443 A | * | 12/1996 | Nakamura et al. | 361/705 |
| 5,636,110 A | * | 6/1997 | Lanni | 363/21 |
| 5,691,891 A | * | 11/1997 | Fasullo et al. | 363/93 |
| 5,973,923 A | * | 10/1999 | Jitaru | 361/704 |
| 6,046,918 A | * | 4/2000 | Jitaru | 363/93 |
| 6,137,392 A | * | 10/2000 | Herbert | 323/361 |

* cited by examiner

Primary Examiner—Jeffrey Sterrett
(74) Attorney, Agent, or Firm—Birdwell, Janke & Durando, PLC

(57) ABSTRACT

A transformer group in which a multitude of transformers are used to supply energy to a single load. The transformers are connected in series; in order to assist in providing a "flux equalizing" affect, the invention includes a flux equalizer circuit. The flux equalizer circuit provides a series of flux windings. Each flux winding is associated with a single transformer. The windings are arranged in parallel. In this manner, a balancing of the output of the transformers is obtained; the power output from each transformer is "sensed" by its associated flux winding which is "shared" with the other transformers via their own associated flux winding. Power is process then through the secondary windings, rectifiers, and output filters to a common load.

4 Claims, 12 Drawing Sheets

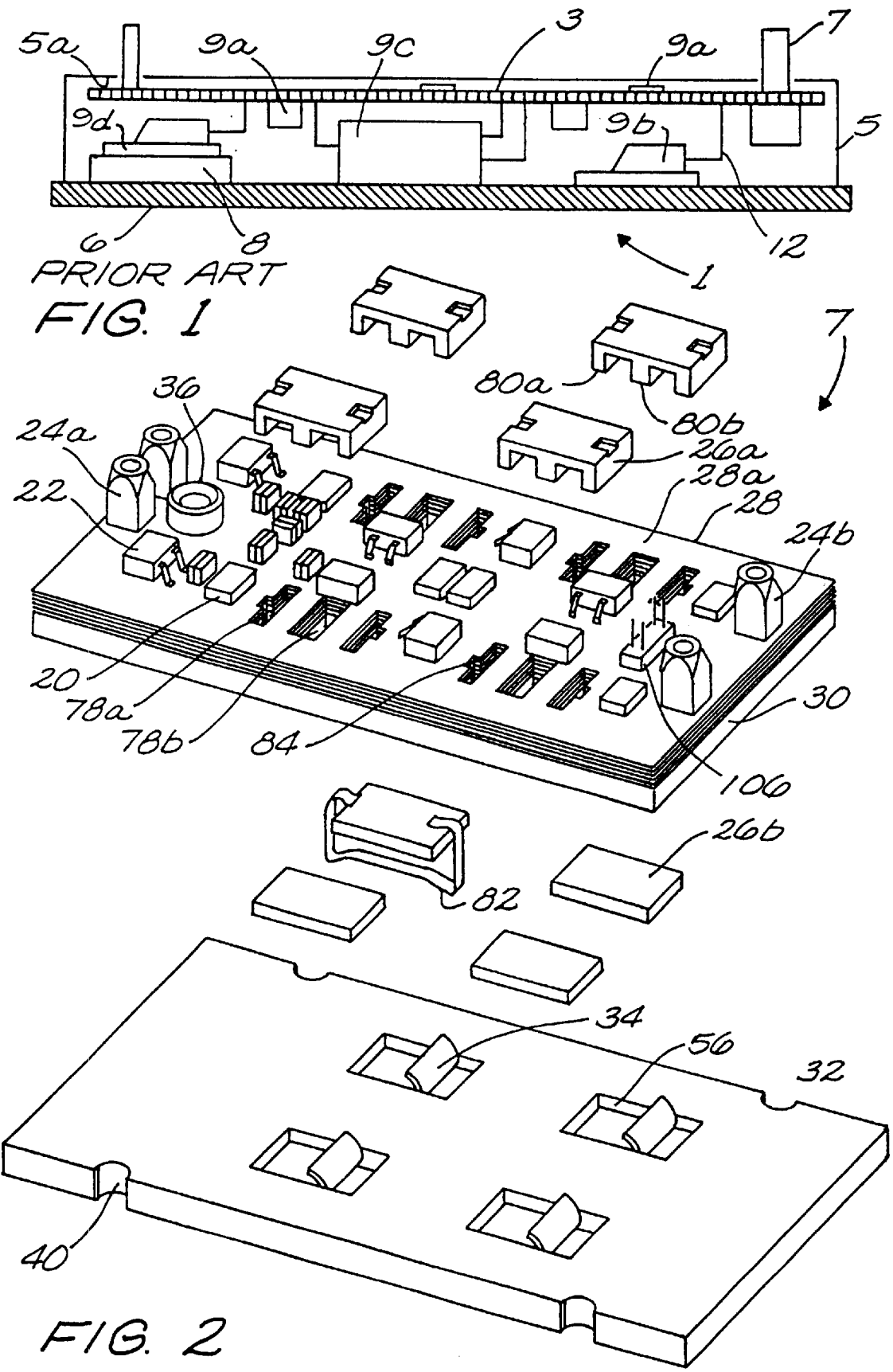

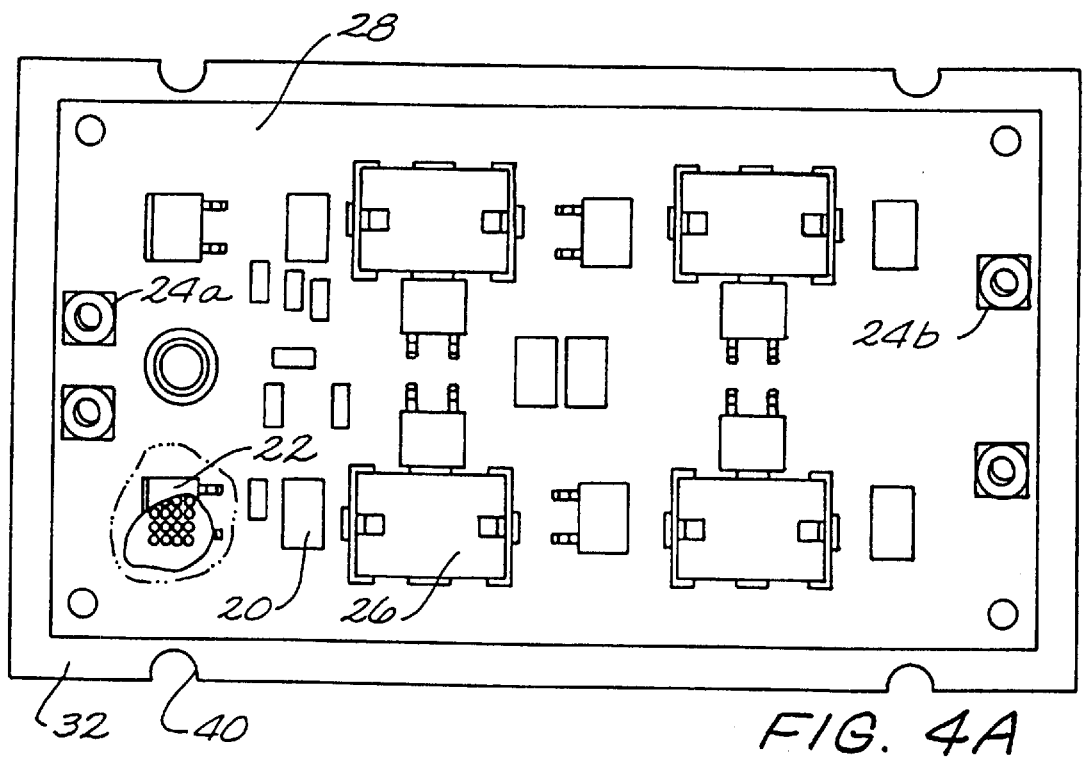
FIG. 4A
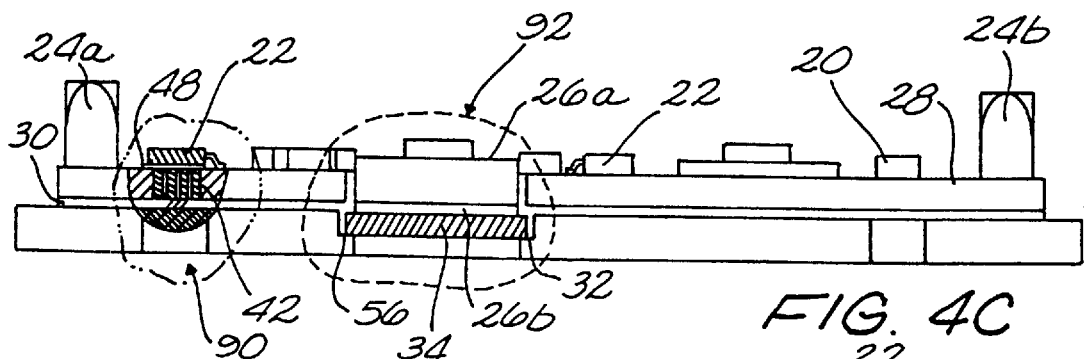
FIG. 4C
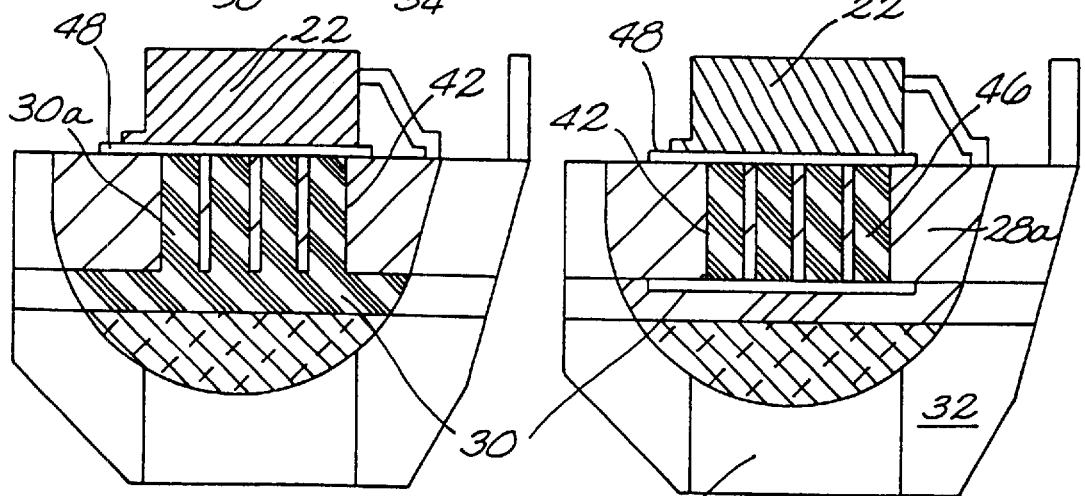
FIG. 4D
FIG. 4B

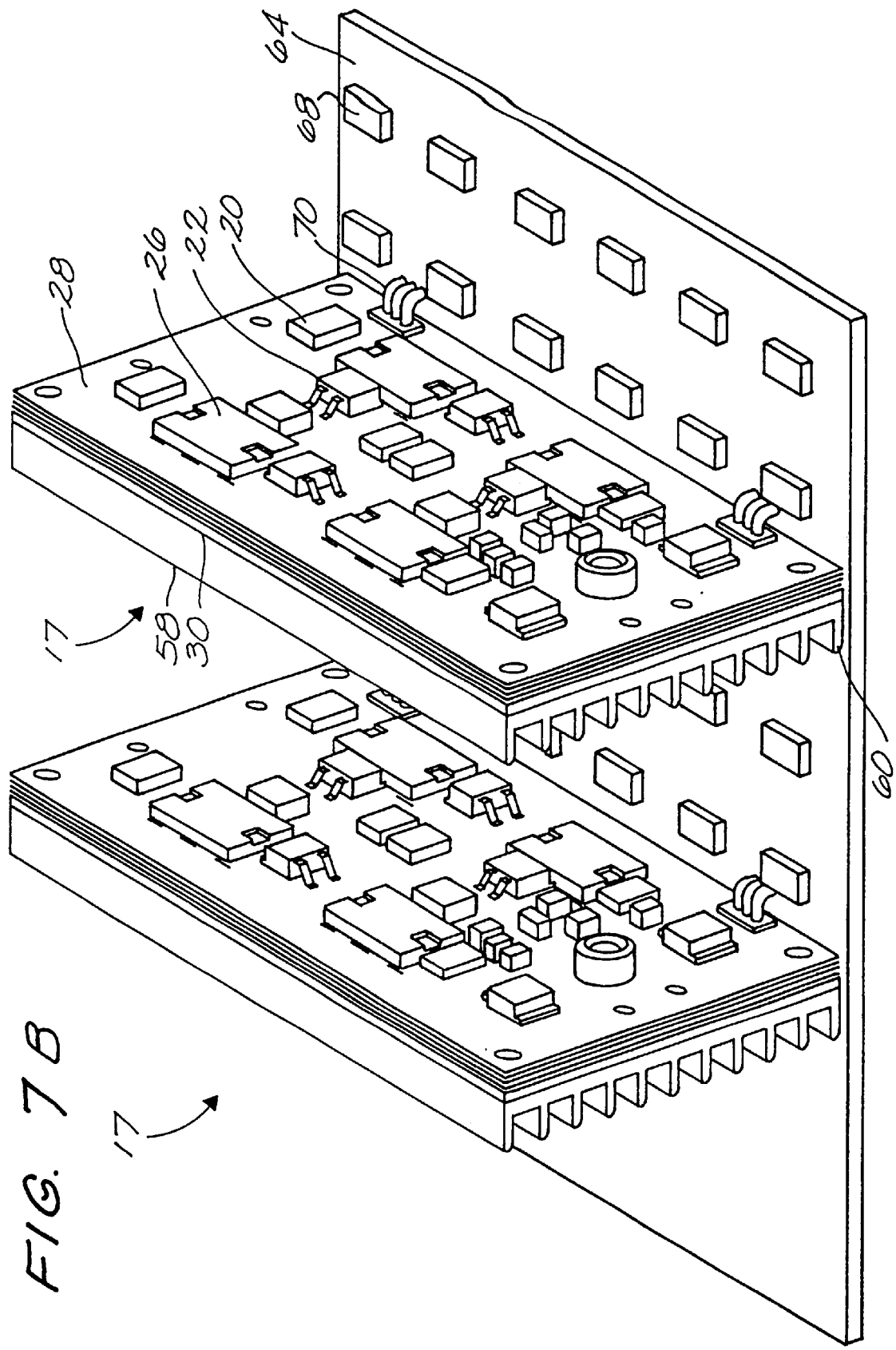

FLUX EQUALIZED TRANSFORMER CIRCUIT

This is a continuation of U.S. patent application Ser. No. 09/310,626, filed on May 12, 1999, and entitled "Flux Equalized Transformer Circuit", now U.S. Pat. No. 6,046,918, which was a continuation-in-part of U.S. patent application Ser. No. 09/086,365, filed on May 28, 1998, and entitled "Packaging Power Converters", now U.S. Pat. No. 5,973,923.

BACKGROUND OF THE INVENTION

This invention relates generally to the electrical design and mechanical packaging of electronic components, and more particularly to a method of power conversion utilizing a multiple transformers primaries in series and secondary in parallel.

One approach to packaging electric components in power converters (FIG. 1) includes a housing which both encloses the components and means of heat extraction from the components. The house includes a non-conductive casing 5 and an aluminum heat-sinking base. A printed circuit board (PCB) 3 is mounted next to the upper wall 5a of the casing. Conductive pins 7 are attached directly to the PCB 3 and extend up through the wall 5a. Electronic components 9a, 9c are mounted to one or both sides of the PCB 3. Larger side components such a the transformer 9c are mounted to the lower side for space reason. Power dissipating devices such as 9b are mounted directly on the base-plate 6 for better heat transfer. The power components 9b are electrically connected to the PCB by leads 12. Some of the power dissipating devices, 9d, are attached to the base plate via a thermally conductive insulator material 8. Structure 1 may be fitted with an encapsulant, which acts as a heat spreader and provides mechanical support. In the case when a hard epoxy encapsulant is used a "buffer coating" material is used to protect some of the components.

In the multiple transformer configuration of this invention, the use of multiple transformers is not new. These multiple secondaries (parallel or not) provide for equal currents but these currents get constricted in the rectifiers and output chokes. Using this type of structure requires large, expensive output chokes and special high current rectifiers which take up precious PCB space. Another drawback to the standard topology is that as device characteristics change over time in the rectifiers and transformers, the currents in the secondaries become more unbalanced while adversely affecting the flux densities in the transformers.

It is clear that there is a need for an improved circuit for multiple transformer systems.

SUMMARY OF THE INVENTION

This invention is related to the electrical design and mechanical packaging of electronic components. It involves a new method of power conversion utilizing a multiple transformers primaries in series and secondary in parallel (or vice versa).

Within the present invention, a transformer group is created in which a multitude of transformers are used to supply energy to a single load. The transformers are connected in series; in order to assist in providing a "flux equalizing" affect, the invention includes a flux equalizer circuit. The flux equalizer circuit provides a series of flux windings. Each flux winding is associated with a single transformer. The windings are arranged in a closed loop. In this manner, a balancing of the output of the transformers is obtained; the flux swing from each transformer is "sensed" by its associated flux winding which is "shared" with the other transformers via their own associated load winding.

As background, the invention provides a packaging technology for power converters and power magnetics. The packaging methodology provides a compact, inexpensive, easy to manufacture. The invention features a package for electrical components held on a circuit board. In this packaging concept most of the power magnetic elements are constructed into the multilayers PCB. The windings of the magnetic elements such as transformer, inductors, and in some cases event signal transformers are incorporated in the multilayers PCB. The top layer and some portion of the bottom layer are also support for electronic components. The windings of the magnetic elements are contained inside of the multilayers PCB; the electronic components are placed on the top and on the bottom of the PCB. Some of the components are located on top of the windings and the interconnections between the magnetic elements. In this way the footprint of the magnetic elements is reduced to the footprint of the transformer core. The power-dissipating devices replaced on pads, which have a multitude of copper coated via to the other side of the PCB. The heat transferred to the other side of the PCB can be further spread using a larger pad or transferred to a metallic base-plate attached to the PCB through an isolating material. For air-cooled due to the limited surface of the heat spreader, an additional heat sink is attache to the heat spreader to increase its cooling area.

The unique aspect of this packaging concept is the fact that the magnetic element's windings are incorporated on the multilayers PCB construction which also serves as a support for power-dissipating components and some of the control components. The heat from the power-dissipating components is extracted through copper coated via which transfer the heat to the other side of the PCB. The heat is further transferred to a metal base plate connected to the PCB via a thermally conductive insulator. For airflow cooling applications the heat spreader connected to the thermal via can serve as a cooling surface. A heatsink can be also attached to the heat spreader to increased the heat dissipation area.

In the multiple transformer configuration of this invention, in order to ensure that the flux level is kept proper for each of the transformers, another secondary winding is added to each transformer to force that the flux densities in each transformer to be equal. In addition, the outputs are paralleled after the output chokes so the currents are spread over multiple secondaries each complete with their own rectifiers and output chokes.

The invention, together with various embodiments thereof, will be more fully explained by the accompanying drawings and the following descriptions.

DRAWINGS IN BRIEF

FIG. 1 is a cross-sectional side view of prior art components packaging.

FIG. 2 is a perspective exploded view of component packaging according to the invention.

FIG. 4A is a top view of the packaging with a detailed section of the cooling via.

FIG. 4C is a section of the packaging through the cooling via and through a magnetic element.

FIGS. 4B and 4D are a broken view of the cooling via herein the insulator material penetrates in the cooling via.

Figure 7A:
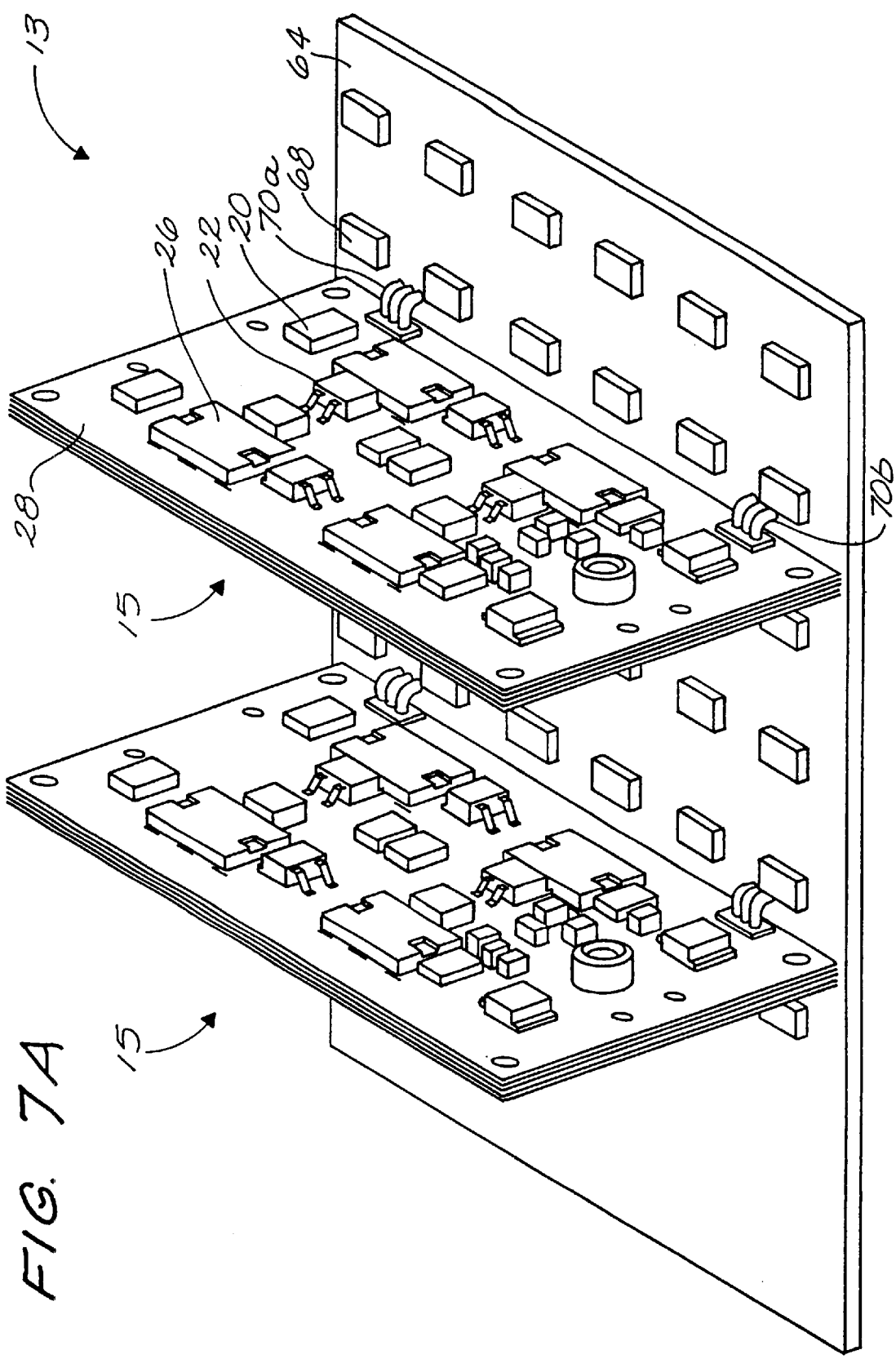

FIG. 7A it is a perspective view of the power packages for airflow cooling.

FIG. 7B is a perspective view of the power packages for airflow cooling and additional heating applied to the multilayers circuit board.

Figure 8:
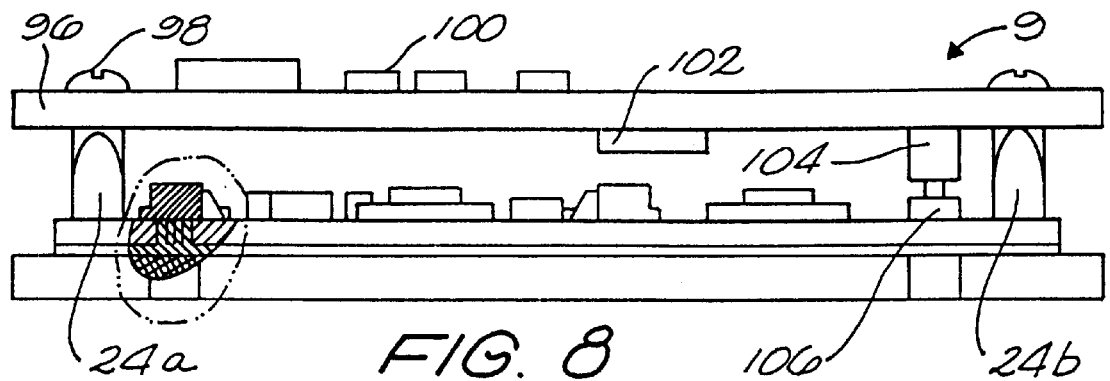

FIG. 8 is a cross-section of the packaging connected to the motherboard.

Figure 9:
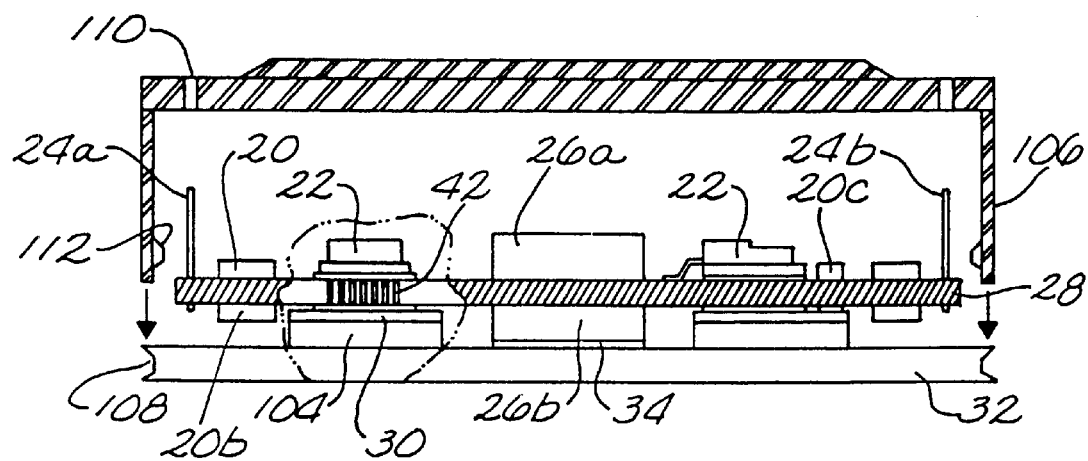

FIG. 9 it is another embodiment of the present invention.

Figure 10A:
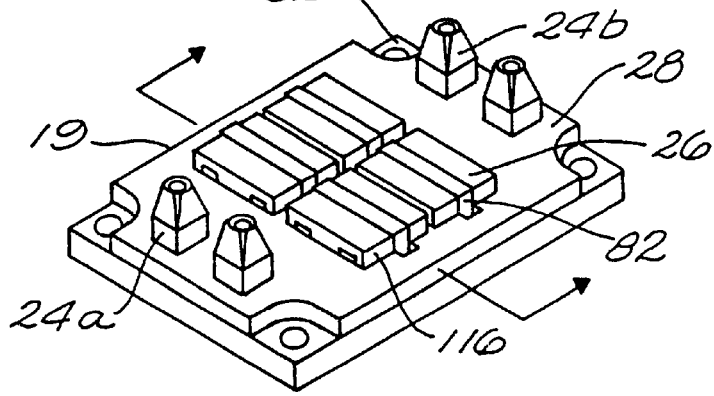

FIG. 10A is a high power magnetics package according to this invention.

Figure 10B:
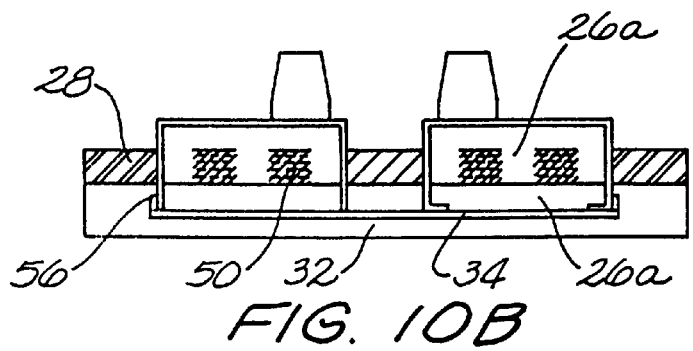

FIG. 10B is a cross-section of the magnetic package presented in FIG. 10.

Figure 11:
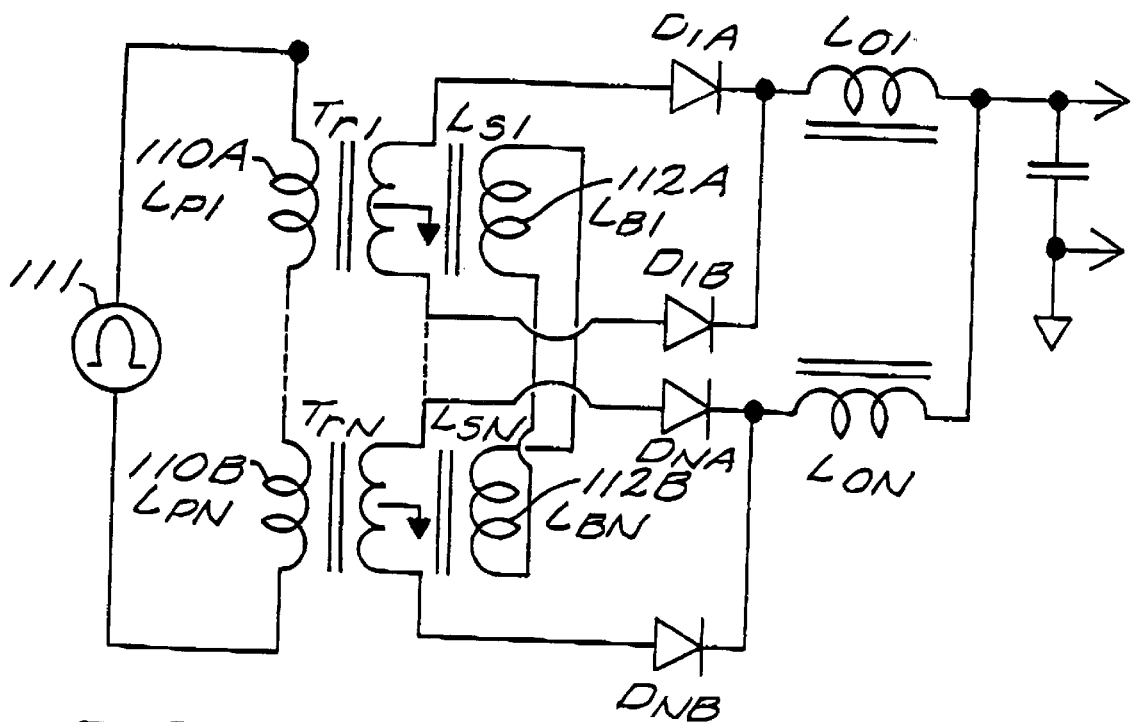

FIG. 11 is an electrical schematic of the preferred embodiment of the multiple transformer using flux equalizing loops.

Figure 12:
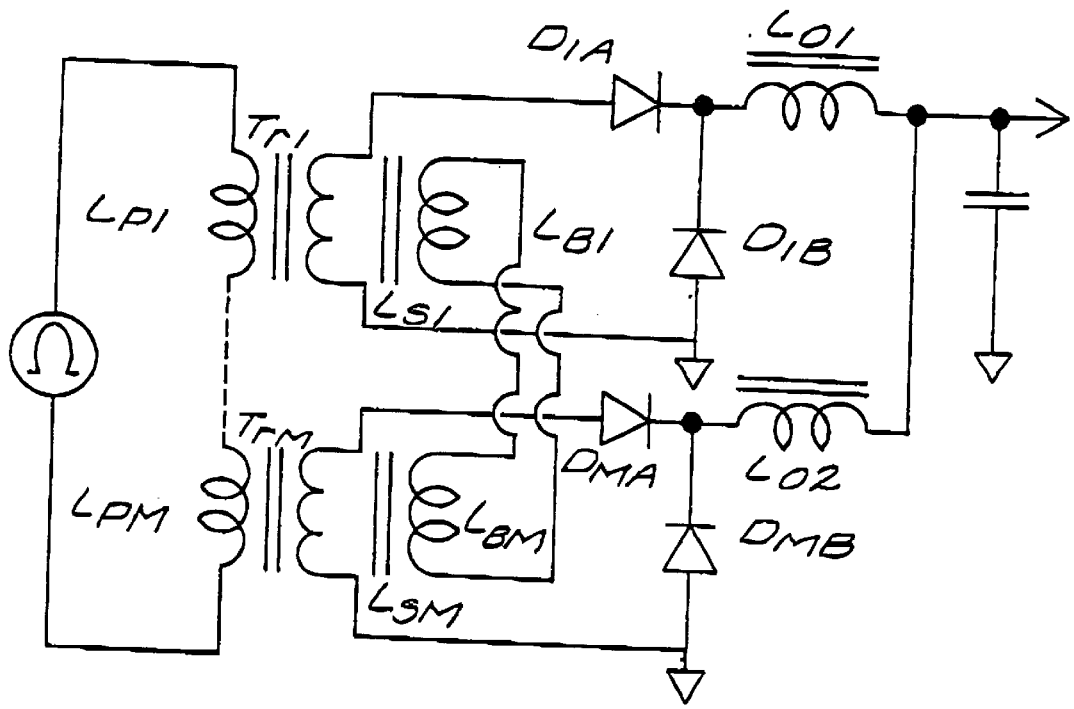

FIG. 12 is an electrical schematic of an alternative embodiment of the multiple transformer invention in which no central taps have been utilized.

Figure 13:
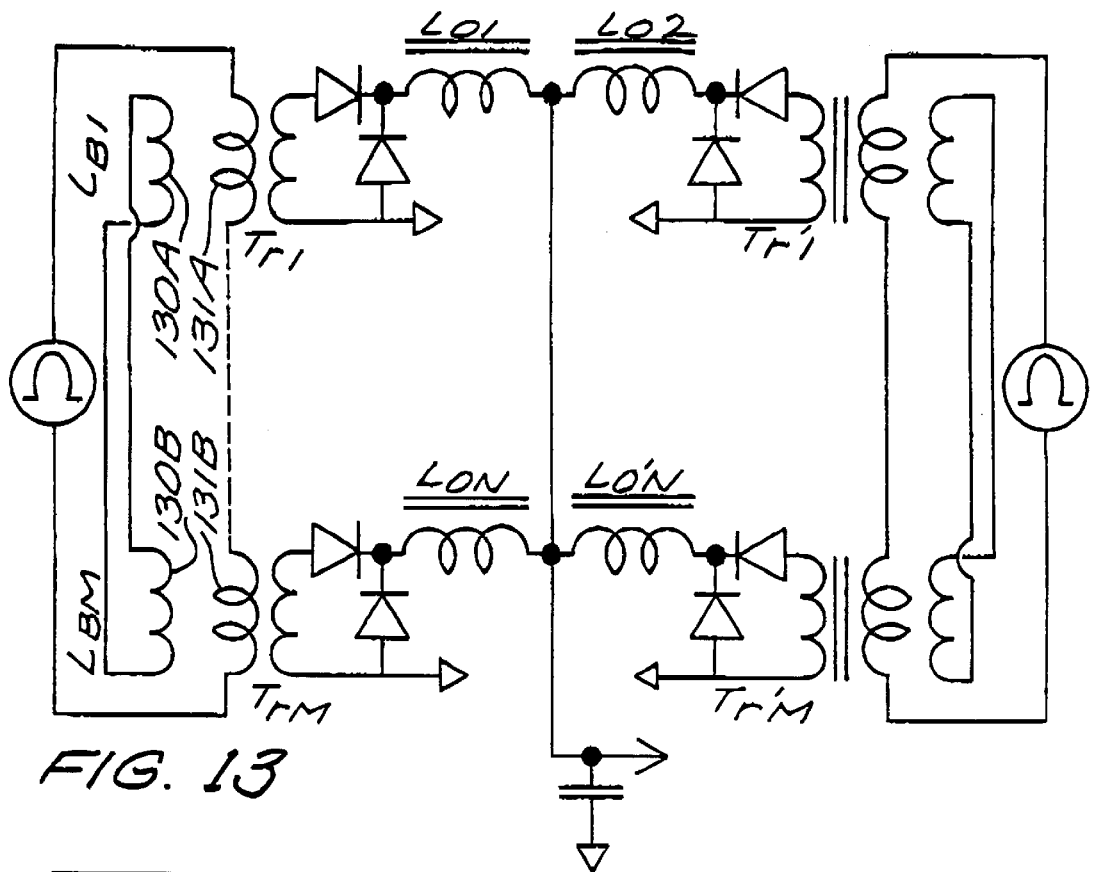

FIG. 13 is an electrical schematic of an embodiment of the multiple transformer invention in which the flux equalizing loops react to electrical flow through multiple power trains.

Figure 14:
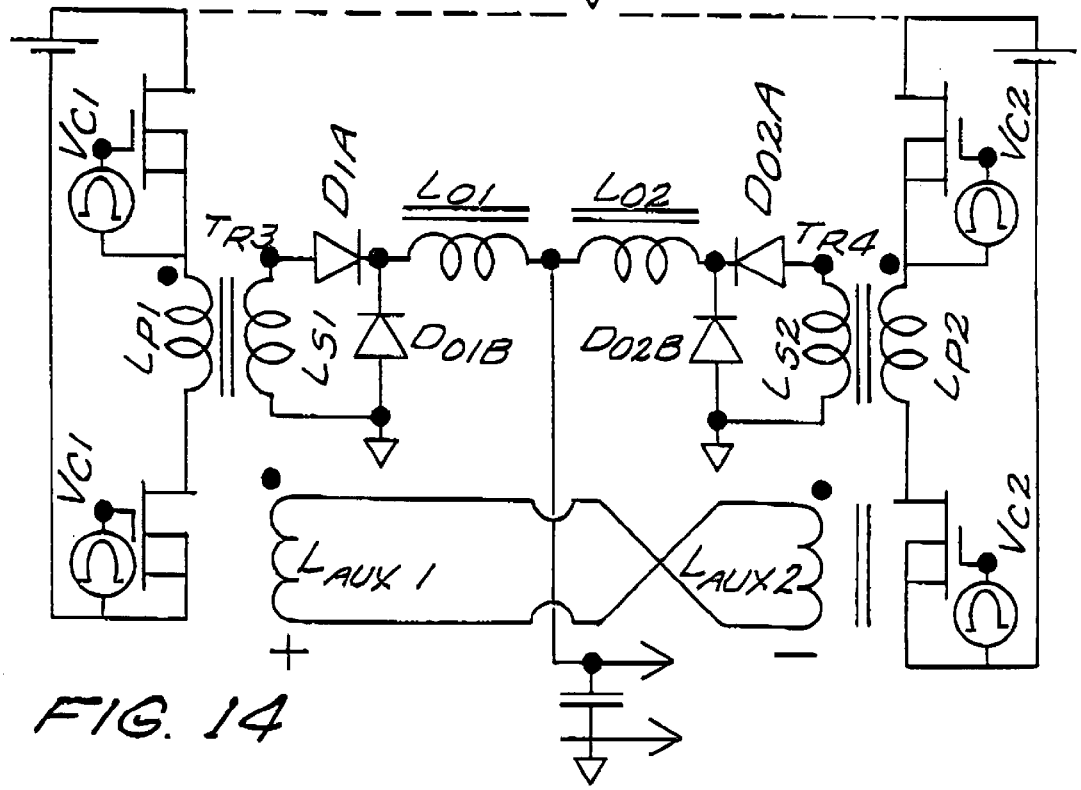

FIG. 14 is an electrical schematic of an alternative embodiment of the multiple transformer invention.

Figure 15:
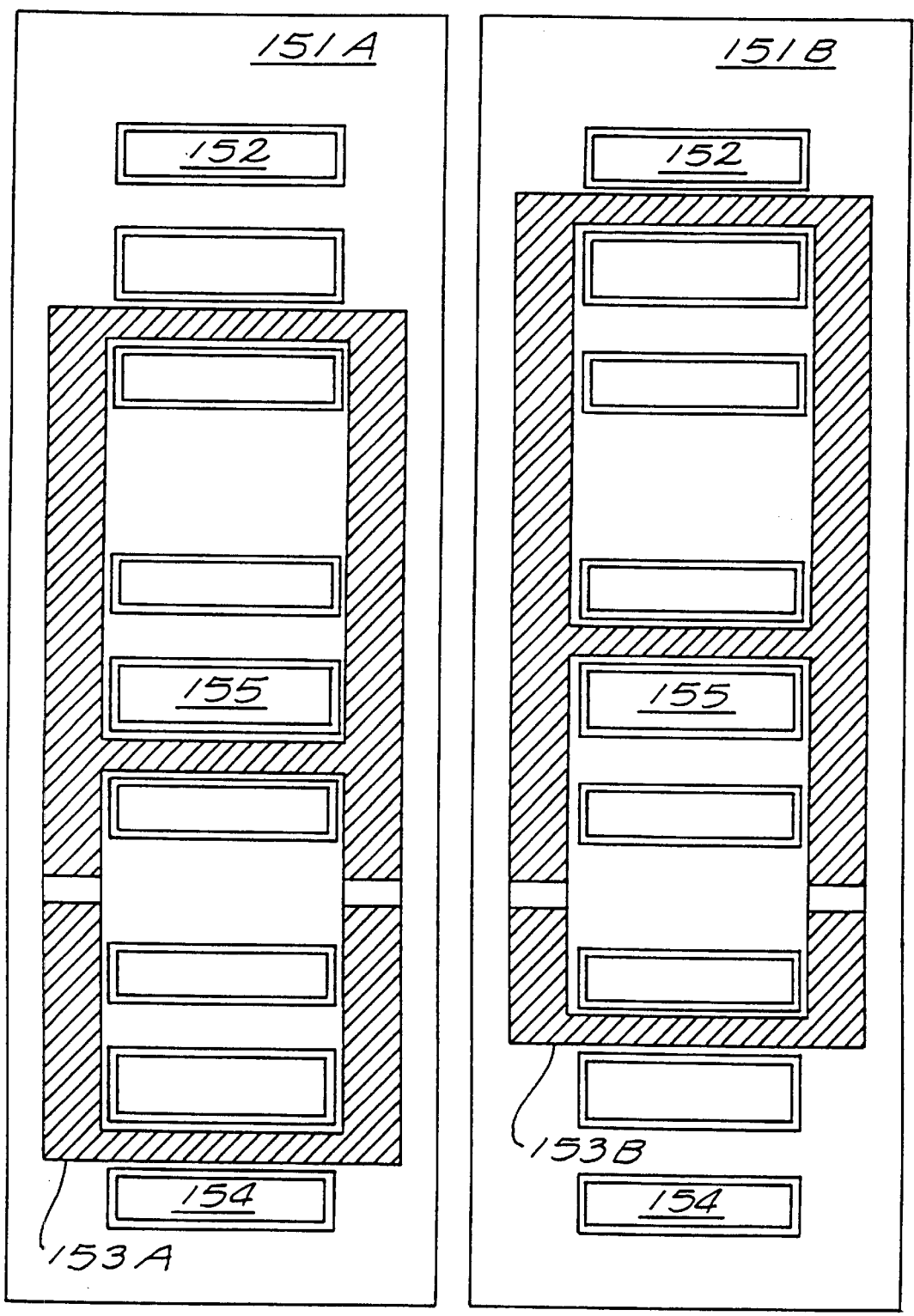

FIG. 15 is a method of implementing the flux equalizing loops of this invention.

Figure 16:
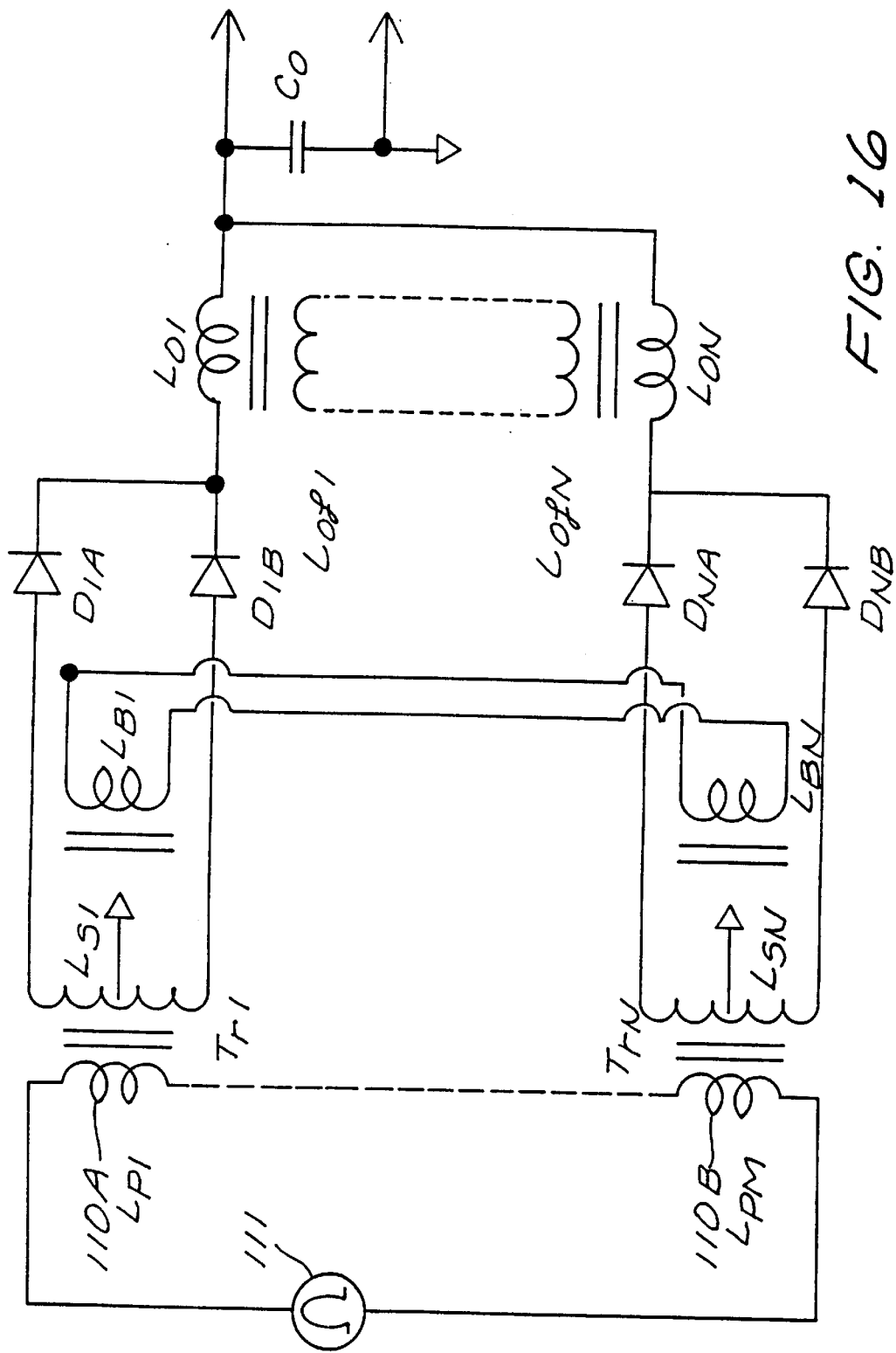

FIG. 16 is an electrical schematic of an embodiment in which the flux equalizing loops are employed also in the output choke.

DRAWINGS IN DETAIL

As described before, FIG. 1, illustrates the prior art of this invention.

Referring to FIG. 2 in the packaging 7 provided by this invention, a power-dissipating electronic components 22 are located on the multilayer PCB 28 on top of the heat spreader pad 48, FIG. 4B. The heat spreader pad is connected to the copper coated via. A heat spreader 74, FIG. 4B, is connected on the backside of the PCB through the copper coated via 42. The copper coated via can be filled with solder or can be empty in which case the heat will be transferred through the metalization placed on the wall of the via. The metalization is formed by copper deposit during the plating process associated with the manufacturing process of the PCB. As a result of the plating process the wall of the via is covered with copper. The via can be also filled with a thermally conductive material 30a as is presented in FIG. 4D. The isolated material 30 placed under the PCB 28 under pressure will penetrate through the via filling the space. In between the 28 and the metal base plate 32 an insulator material with good thermal conductivity characteristics 30 is placed. In this way the heat from the power dissipating components 22, is transferred through the copper pad 48 on which the power dissipating device is mounted, to the copper coated via 42 to the other side of the PCB, 28B, to the heat spreader 74. The heat is further transferred through the thermally conductive insulator material 30 to the metal plate 32. In the case wherein the insulator material 30 will penetrate through the copper coated via 42 the surface contact will increase and as a result the thermal transfer from the copper pad 48 to the metal plate 30 will be improved.

The main embodiments of this invention is the magnetic elements implementation in the multilayers PCB and the means in which the heat is extracted form the power dissipating devices, from the magnetic winding 50, some components 88 are mounted on top of the multilayers PCB 28a, on top of the windings 50 embedded in the inner layers of the multilayers PCB 28. In this way the footprint of the magnetic element is reduced to the footprint of the magnetic core 26a.

The main embodiment of this invention is the fact that the magnetics elements are implemented in the multilayers PCB 28. In the prior art the magnetic elements were discrete devices which were connected to the PCB by means of through hole or surface mounted pins. The presence of the connecting pins increases the coast of the magnetic element and it reduces the reliability of the magnetic device due to the mechanical failure of the pins. The interconnection pin can be bent or broken easily. The presence of the interconnection pins adds supplementary stray inductance in series with the transformer. This will negatively impact the electrical performance of the circuit. In most of the applications the energy contained in this parasitic inductance is dissipated, reducing the parasitic inductance of the inter connection pins can increase to voltage or current stress on the electrical components.

In this invention the magnetic elements have the windings embedded inside of the multilayer PCB. The interconnection between the magnetic elements and between the magnetic elements and the electronic components are made through copper pads etched in the layers of the multilayer PCB and through the copper coated via 42 in the multilayer PCB 28. This allows the use of more complex winding arrangements and allows the use of more magnetic elements on the same multilayer PCB construction. The interconnections of these magnetic elements are made within the multilayer PCB. The converter will contain a number of smaller magnetic elements achieving a low profile package. The magnetic cores 26A and 26b will penetrate through multilayer PCB via the cutouts 78a and 78b fitted for the outer legs 80a and inner legs 80b. The magnetic sections 26a and 26b can be glued together or attached via a spring clips 82. To accommodate the spring clip additional cutouts in the PCB 84 are produced. The bottom side of the magnetic core 26b, will surface on the back of the PCB. To be able to accommodate the magnetic cores 26b cutouts 86 are made through the insulator material 30. In most of applications the thickness of the insulator material is smaller than the height of the magnetic core. To accommodate the magnetic core 26b, cavities 56, are produced into the base plate 32. Due to the fragile characteristic of the magnetic cores, a soft pad 56, with small thermal impedance is placed under the magnetic core 26b in the cavity. The pad 56, will dampen the vibration of the magnetic core, The low thermal impedance of the pad 56, will also offer a cooling path for the magnetic core. In some applications wherein insulation has to be achieved to the base plate, the pad, 56 have to have insulation properties.

The entire structure 7 is press together in a way that the magnetic core 26b will be placed on top of the pad 56. The thickness of the pad has to chosen in a way that the metallic plate 32 makes good contact with the insulator 30. The insulator 30, is pressed between the PCB 28 and metal plate 32. The permanent attachment can be done in several ways. In the preferred embodiment the isolator material 30 has adhesive properties stimulated by a curing process at higher temperature. After the curing process the insulator created a bound between the PCB 28, and the metal plate 32. In applications wherein the structure 28 is connected to anther plate, the flanges 40 can accommodate screws.

A cross-section of the structure 7, mounted is presented in FIG. 4C. A section of the structure is blown in FIG. 4B. In the cross-section of the structure 90 is presented the location of a power dissipation device on top of the copper pad 48, and the coated via 42. The copper coated via carry the heat to the heat spreader 74. The heat is further transferred via the thermally conductive insulator 30 to the metal plate 32.

A second cross-section of the mounted structure 7, is presented in FIG. 4C. In the cross-section, 92, is presented the upper section of the magnetic core 26a, the bottom section of the magnetic core 26b, the pad under the magnetic core 34 located in the cavity 56. The heat generated in the magnetic core 26 is transferred to the base plate through the pad 34. For components which have to have a temperature close to the temperature of the base plate, copper coated via are placed under the components or to the traces and pad connected to the components. In this way low thermal impedance is achieved to the base plate. With low thermal impedance to the base plate, the temperature rise of these components will be small.

Using screws, clips, or different means of applying pressure to the structure 7 can also make the attachment of the PCB 28, to the isolator 30 and the base-plate 32. In some applications the cutouts in the metallic plate 32 can penetrate through the plate. The magnetic cores 26b will be visible from the bottom side of the metallic plate. For protecting the magnetic cores 26b, soft epoxy material can cover the remaining cavity in between the magnetic core and the surface of the base plate 32. In some application that cavity can be left open.

In FIG. 8 is presented a structure 9 wherein the package 7 is attached to a motherboard 96. The attachment is done through the power connectors 24a and 24b. The power connectors are attached to the motherboard 96 through screws 98. There is a signal connector 106 located on the structure 7. The signal connector 106 is connected to the matching signal connector 104 located on motherboard 96. More than one structure 7 can be connected to the same motherboard 96. On the motherboard 96 there are additional components 100 and 102. This structure it is suitable for systems wherein only the power train and some control functions are located on the structure 7. Some of the control section components, supplementary logic circuits and EMI filters are located on the motherboard. The bottom layer of the motherboard 96 may contain copper shields to protect the noise sensitive components. The noise sensitive components are located on the motherboard and the power dissipate components, some control components and the magnetics are located on the structure 7.

Figure 3A:
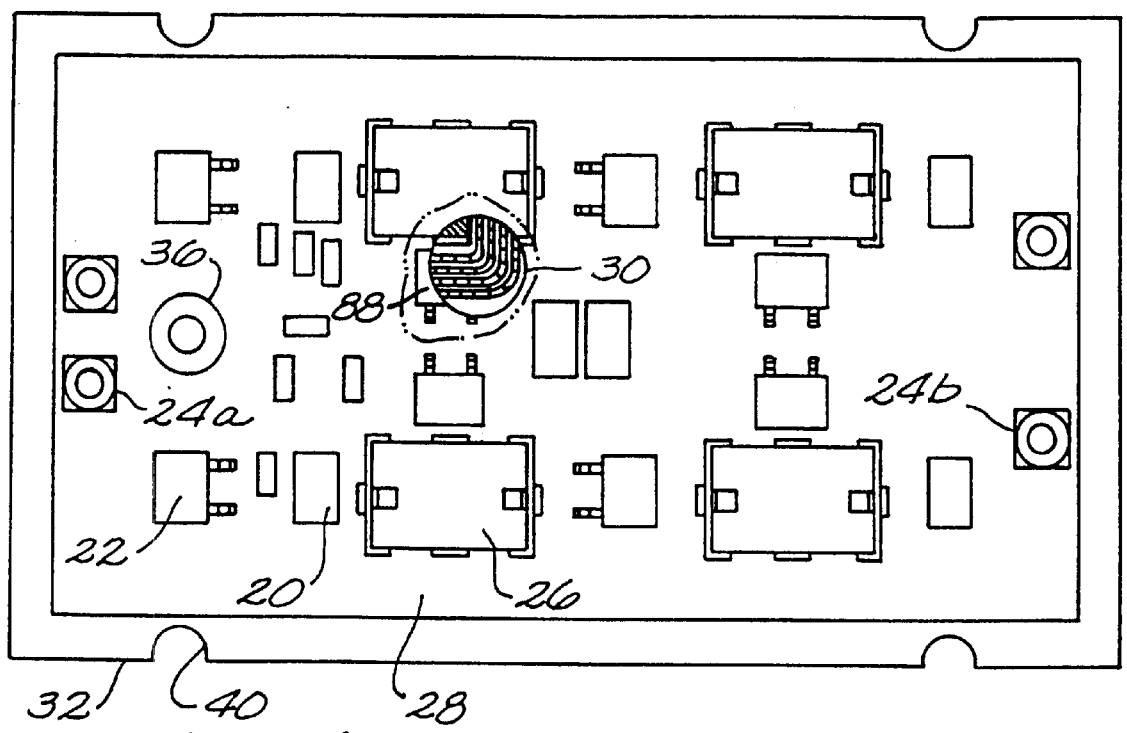
FIG. 3A is a top view of the packaging with a detailed section of the magnetic' winding.
Figure 3B:
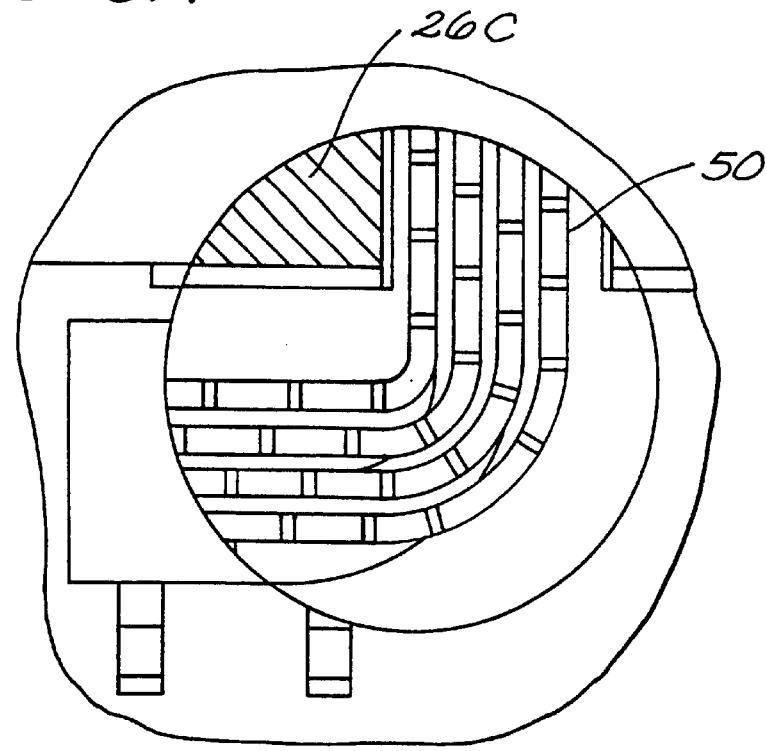
FIG. 3B is an enlarged view of a section of FIG. 3A
Figure 5A:
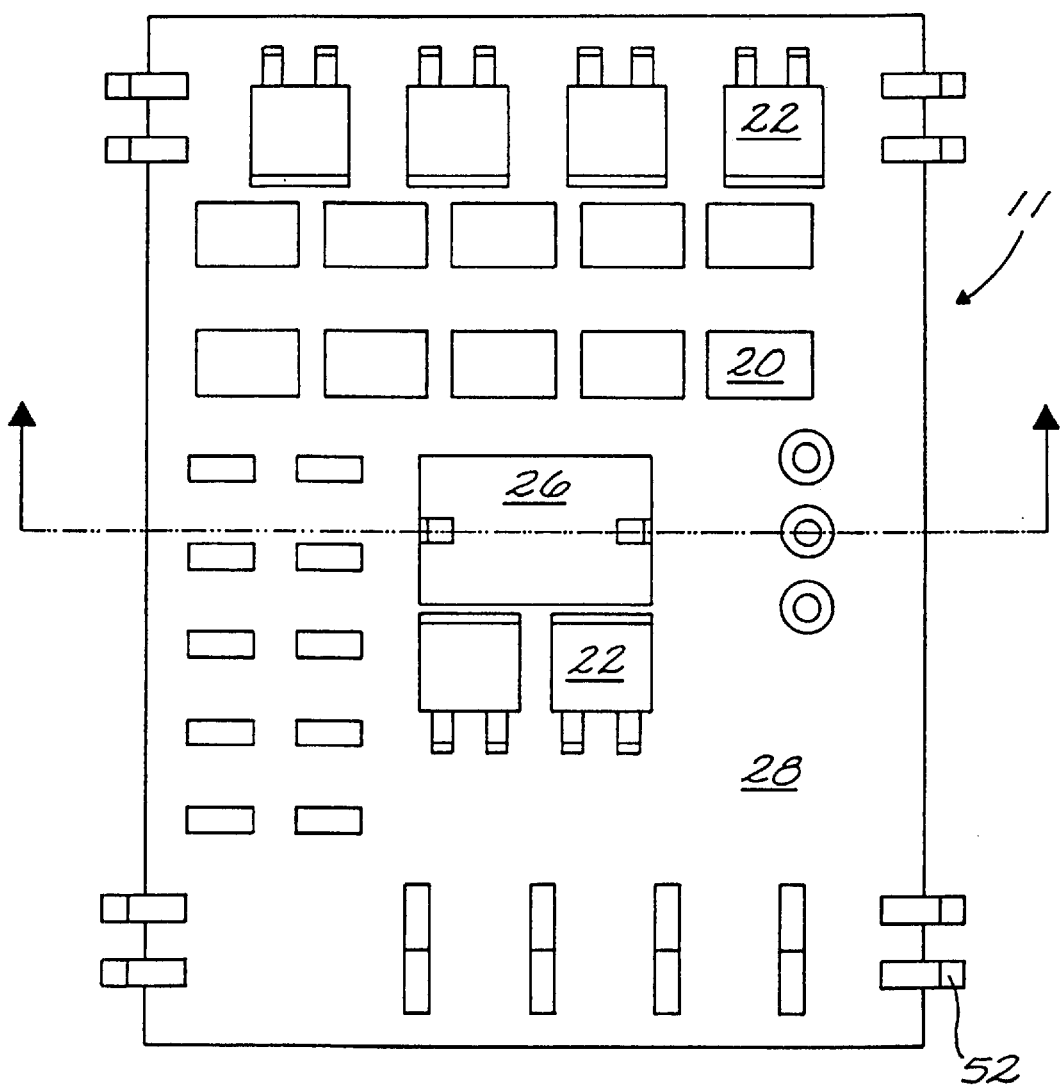
FIG. 5A is the top view of the horizontal packaging with airflow cooling.
Figure 5B:
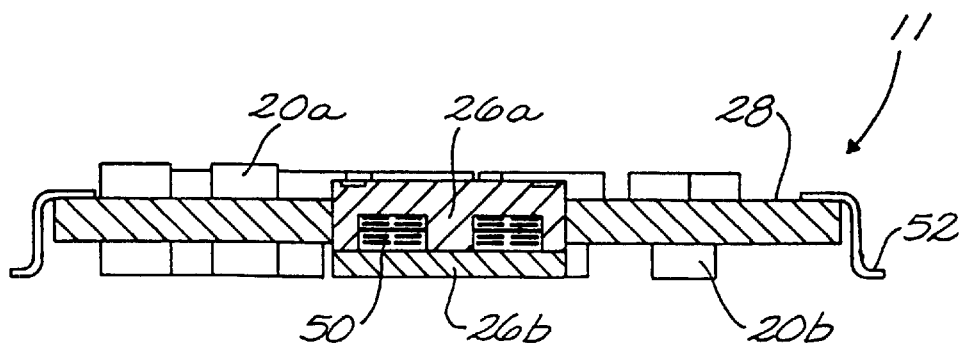
FIG. 5B is a cross section of the embodiment of FIG. 5A.

In FIGS. 5a and 5b is presented a packaging structure 11. In this structure the magnetic element has its winding embedded within the multilayers PCB 28 as it is in structure 7. The components are located on both sides of the multilayers PCB. This packaging structure applies to low power dissipation application wherein there is an airflow. The entire surface of multilayers, PCB 28 becomes a heatsink. The structure 11 is connected to the other circuitry via the pins 52.

In FIG. 7A is depicted a power system which contains several packaging structures 15. The structure 15 include the magnetic elements 26, the power dissipating components 22, the low power dissipation components 20, similar with structure 7. The main difference is that there is not an isolator 30, and a base plate 32. The cooling is accomplished by the air, which flows in between the packaging structures 15. The entire surface of 15 becomes a heatsink. The structures 15 are connected to the motherboard 64 through signal connectors 70a, and power connectors 70b.

Supplementary components are located on the motherboard 64.

In FIG. 7B the motherboard 64 is connected to two packaging structures 17. These packaging structures contain the same components as structure 15 with an additional heat sink 58 attached to the multilayers PCB 28 through the insulator 30.

Figure 6:
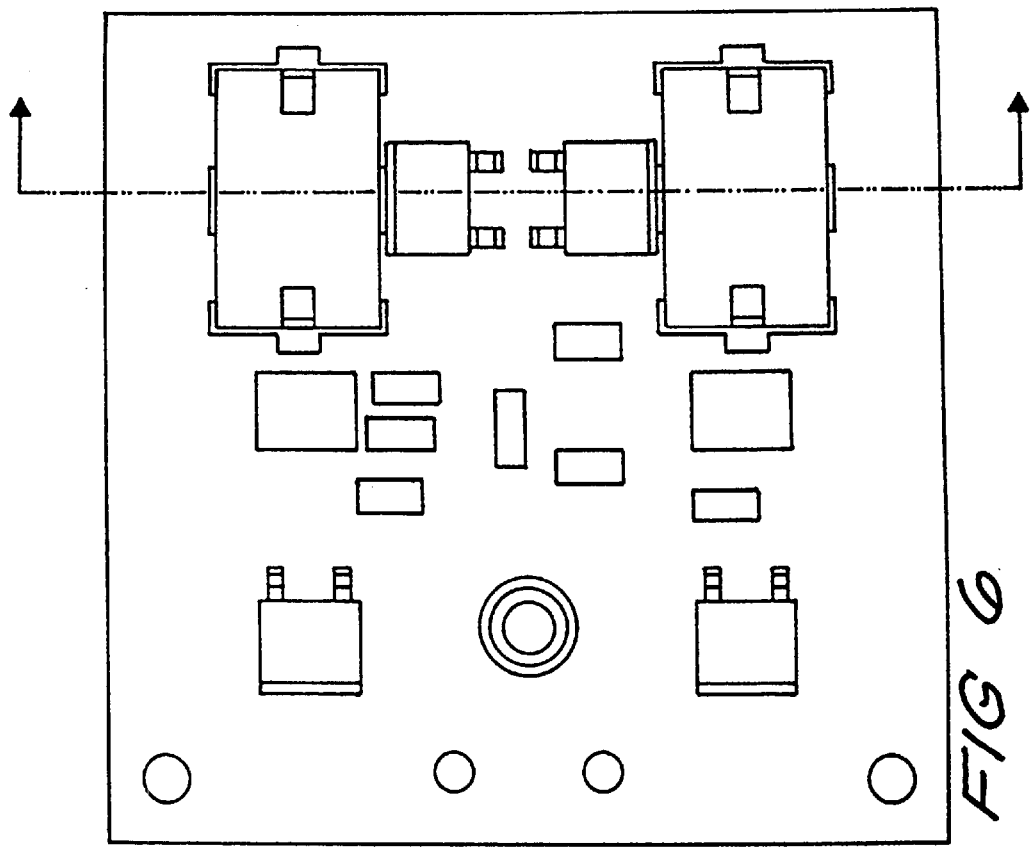
FIG. 6 is a top view of the packaging
Figure 6A:
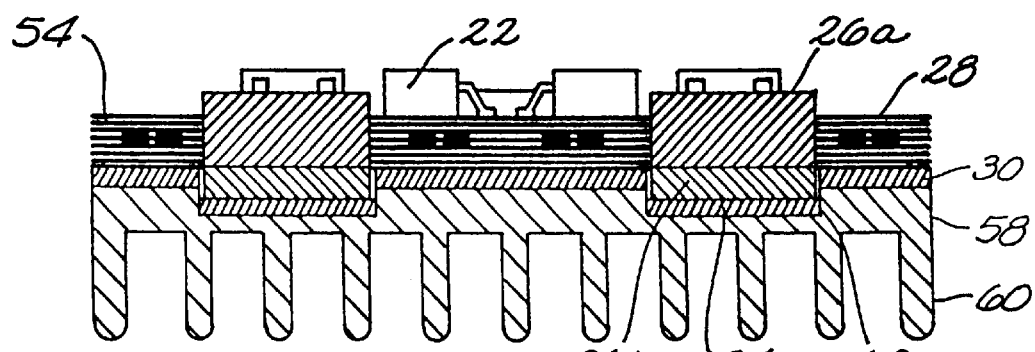
FIG. 6A is a cross-section of the package with cooling by airflow and cavities for magnetic cores.

Two types of heatsink construction are presented in FIGS. 6A and B. In FIG. 6A the heatsink 58 has air fins 60 and cavities 62. In the cavities a soft compressible material 34, with low thermal impedance is placed. The insulator with low thermal impedance 30 is placed between the multilayers PCB 28 and the base plate 58. The magnetic core 26b is cooled via the soft pad 34. The power-dissipation devices are cooled though copper coated via like in structure 7.

Figure 6B:
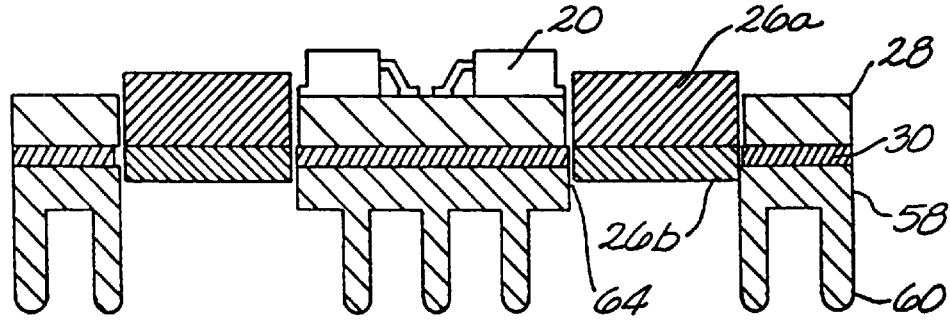
FIG. 6B is a cross-section of the package with cooling by airflow and holes for magnetic cores.

In FIG. 6B the heatsink 58 with air fins 60 has cutout-outs 64 to accommodate for the magnetic core 26b. The cooling of the magnetic core 26a and 26b is accomplished by the airflow. The cooling of the power-dissipation devices is done through copper coated via 42.

In FIG. 9 is presented a packaging structure wherein the metal plate 32 does not contain cavities. It has elevated sections 104, which makes contact with the thermally conductive insulator 30, which is placed under the multilayers PCB 28. The elevated sections of the metal plate 104 are primarily placed under the power dissipated devices 22 and other low dissipation components 20c which require to have a temperature close to the base plate temperature. The thermally conductive soft pad 34, on the base plate 32 supports the magnetic core 26a and 26b. The height of the elevated section of the baseplate 104, are function of the height of the magnetic core 26b and the compression ratio of the pad 34. The advantage of the packaging concept is the fact that more components can be mounted on the multilayers PCB on the backside 20b. This package is suitable for power converters, which contains all the control and signal interface functions. The interconnection pins 24a and 24b will provide the power and signal connections to the outside word. The cover 106 contains holes 110 to accommodate the interconnection pins 24a and 24b.

For the purpose of attaching case 106 to the baseplate 32 (FIG. 9) teeth 112 are formed along the lower edge of the case. A matching grove 108 is undercut into the base plate 32.

In FIG. 10A is presented a high power magnetic structure wherein the magnetic core is formed by several small magnetic cores 26. A cross-section through the structure 19 is presented in FIG. 10B. The windings 50 of the magnetic structure are embedded in the multilayer PCB layers. The cutout 116 in the multilayers PBC 28 are made to accommodate the magnetic cores 26. Power connectors are inserted in the multilayers PBC 28. The connectors 24a and 24b are connected to the windings 50. The cores 26a and 26b are attached together via the clips 82. The multilayers PCB 28 wherein the windings 50 are embedded into also offers supports for the magnetic cores 26. A cavity 56 is placed in the base plate 32. A thermally conductive soft pad is placed under the magnetic core 26b on top of base plate 32.

FIG. 11 is an electrical schematic of the preferred embodiment of the multiple transformer using flux equalizing loops.

As shown, two (or more) separate primary windings (110A, 110B) are placed in series together in an effort to split the total output power amongst them in an effort to reduce the size and cost of high power, high efficiency power conversion. The source for the primary is an AC source 111. There are multiple primaries denoted $L_{PN}$ which are connected in series.

In this-embodiment, the transformer is optionally a discrete type of transformer which is soldered to the PCB or it is constructed of windings embedded in a multilayer PCB with an E-cores.

Separating the primaries (and secondaries) in this manner provides for smaller components in the power train. This allows for higher power densities due to smaller components and lower losses in these power devices. The secondaries are placed in parallel prior to the output chokes.

The present invention provides for a balancing the output power needs between the multiple secondaries. In this preferred embodiment, an auxiliary secondary winding (112A, 112B) is added to each transformer in such a way to balance the flux densities between the transformers. These secondary windings are denoted $L_{B1}$–$L_{BN}$ and are connected together in parallel as shown in FIG. 1. When an imbalance occurs between the separate transformers, currents flow in this secondary winding to force the flux densities in the transformers to be equal. Current sharing in this way accounts for differences in device characteristics between the different power trains which is desirable.

While only two transformers are illustrated, the invention contemplates the use of multiple transformers as required to meet the demands of the circuit and load in question.

FIG. 12 is an electrical schematic of an alternative embodiment of the multiple transformer invention in which no central taps have been utilized.

The embodiment of FIG. 12 performs in an identical manner as that of FIG. 11, except that in the FIG. 12 embodiment, the transformers do not have a central tap.

The elimination of the central tap illustrates the versatility of the present invention.

FIG. 13 is an electrical schematic of an embodiment of the multiple transformer invention in which the flux equalizing loops react to electrical flow through multiple power trains. These multiple power trains can be phase shifted to reduce the input and output current ripple.

FIG. 14 is an electrical schematic of an alternative embodiment of the multiple transformer invention.

The auxiliary windings Laux1 and Laux2, are connected in parallel with reverse polarity to insure a bi-directional flux swing in the transformers.

FIG. 15 is a method of implementing a flux equalizing loop.

Layer 151A and 151B are two different layers of a multi-layered printed circuit board. Magnet core 152 extends through the multi-layered printed circuit board. Other magnet cores 155 and 154 are also positioned through the PCB. Copper layer 153A is used to create the flux windings; flux windings created by copper layer 153B is offset to create the required phase shift.

These drawings present a simple and effective methodology of the flux equalizing windings implementation. This method has the advantage that the copper layout can be used for multiple functions such as shield, heat spreader and even flux tunneling.

FIG. 16 is an electrical schematic of an embodiment in which flux equalizing loops are employed also in the output choke.

The flux equalizing loops $L_{B1} \ldots L_{BN}$ will ensure an equal flux swing in the transformer $T_{R1} \ldots T_{RN}$. The flux equalizing loops $L_{ofL} \ldots L_{ofL}$ will ensure equal flux swing in the output inductance elements $L_{O1} \ldots L_{ON}$ for stead state and dynamic operating conditions.

In some applications, the coupling between $L_{O1} \ldots L_{ON}$ and $L_{of1}$ and $L_{ofN}$ can be loose, without deviating from the scope of this invention. The same applies to the coupling between $L_{B1} \ldots L_{BN}$ and the rest of the winding of $T_{R1} \ldots T_{RN}$.

It is clear from the foregoing that the present invention creates a highly improved transformer package which provides for the enhanced provision of power with the burden properly split between the transformers.

What is claimed is:

1. A flux equalizer circuit, comprising:
  a) a first flux winding positioned to have an electrical flow induced therein when electrical energy flows through a first transformer; and
  b) a second flux winding positioned to have an electrical flow induced therein when electrical energy flows through a second transformer, said second flux winding having a first end and a second end, the first end of said second flux winding being electrically connected to the second end of said first flux winding, and the second end of said second flux winding being electrically connected to the first end of said first flux winding such that current induced within the flux equalizer circuit freely flows between said first flux winding and said second flux winding.

2. The flux equalizer circuit according to claim 1, wherein the first transformer has a first primary winding, a first side of the first primary winding being connected to a power source, and a first secondary winding positioned to have an electrical flow induced in the first secondary winding when electrical energy flows through the first primary winding, wherein the second transformer has a second primary winding, a first side of the second primary winding being connected to a power source, and a second side of the second primary winding being connected to a second side of the first primary winding, the flux equalizer circuit further comprising a load, wherein said first and second secondary windings communicate electrical energy to said load.

3. The flux equalizer circuit according to claim 2, further comprising a first rectifier circuit imposed between the first secondary winding and said load, and a second rectifier circuit imposed between the second secondary winding and said load.

4. The flux equalizer circuit according to claim 3, further comprising a first filter element imposed between said first rectifier circuit and said load, and a second filter element imposed between said second rectifier circuit and said load.

* * * * *